United States Patent
Khaddam-Aljameh et al.

(10) Patent No.: US 10,777,253 B1
(45) Date of Patent: Sep. 15, 2020

(54) MEMORY ARRAY FOR PROCESSING AN N-BIT WORD

(71) Applicant: International Business Machines Corporation, Armonk, NY (US)

(72) Inventors: Riduan Khaddam-Aljameh, Zurich (CH); Manuel Le Gallo-Bourdeau, Zurich (CH); Abu Sebastian, Adliswil (CH); Evangelos Stavros Eleftheriou, Rueschlikon (CH); Pier Andrea Francese, Adliswil (CH)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/385,303

(22) Filed: Apr. 16, 2019

(51) Int. Cl.
| | |
|---|---|
| G11C 11/406 | (2006.01) |
| G11C 11/56 | (2006.01) |
| G11C 11/4096 | (2006.01) |
| G11C 11/16 | (2006.01) |
| G11C 11/405 | (2006.01) |

(52) U.S. Cl.
CPC .... G11C 11/40622 (2013.01); G11C 11/1655 (2013.01); G11C 11/405 (2013.01); G11C 11/4096 (2013.01); G11C 11/5628 (2013.01)

(58) Field of Classification Search
CPC .......................... G11C 11/405; G11C 11/4096
USPC ....................................................... 365/149
See application file for complete search history.

(56) References Cited

U.S. PATENT DOCUMENTS

| | | | | |
|---|---|---|---|---|
| 2002/0174311 A1* | 11/2002 | Ware | ........................ | G06F 1/12 711/167 |
| 2005/0163277 A1* | 7/2005 | Georgakos | ............... | G11C 8/04 377/64 |
| 2006/0077731 A1* | 4/2006 | Ware | ........................ | G11C 5/04 365/194 |
| 2016/0232951 A1* | 8/2016 | Shanbhag | ................ | G11C 7/12 |
| 2018/0122456 A1* | 5/2018 | Li | ........................... | G06F 15/80 |
| 2019/0198093 A1* | 6/2019 | Khellah | ................ | G11C 11/412 |

OTHER PUBLICATIONS

Gonugondla et al., "Variation-Tolerant In-Memory Machine Learning Classifier via On-Chip Training", IEEE Journal of Solid-State Circuits, vol. 53, No. 11, Nov. 2018, pp. 3163-3173.

(Continued)

*Primary Examiner* — Anthan Tran
(74) *Attorney, Agent, or Firm* — Scully, Scott, Murphy & Presser, P.C.; Daniel P. Morris

(57) ABSTRACT

A memory array comprises a data block comprising N serially connected cells. Each cell of the cells comprises a memory element storing a respective bit of the word, a charge adding unit and a switching logic. The last cell of the cells is further configured to receive a sequence of M bits. The memory array further comprises an output block serially connected to the data block. The output block comprises a result accumulation unit. The memory array is configured to operate in accordance with a 3-phase clocking scheme having a sequence of M groups of clock cycles associated with the respective sequence of M bits. The memory array is configured such that a successive and repetitive application of the three phases enables an application of a phase during each clock cycle of the M groups.

13 Claims, 7 Drawing Sheets

(56) References Cited

OTHER PUBLICATIONS

Agrawal et al., "Xcel-RAM: Accelerating Binary Neural Networks in High-Throughput SRAM Compute Arrays", IEEE School of Electrical and Computer Engineering, Purdue University, West Lafayette, IN-47907, USA, Jul. 1, 2018, 7 pages.
Biswas et al., "Conv-RAM: An Energy-Efficient SRAM with Embedded Convolution Computation for Low-Power CNN-Based Machine Learning Applications", 2018 IEEE International Solid-State Circuits Conference, Feb. 11-15, 2018, pp. 488-490.
Jaiswal et al., "8T SRAM Cell as a Multi-bit Dot Product Engine for Beyond von-Neumann Computing", IEEE Feb. 22, 2018, 7 pages.
Lee et al., "Analysis and Design of a Passive Switched-Capacitor Matrix Multiplier for Approximate Computing", IEEE Journal of Solid-State Circuits, vol. 52, No. 1, Jan. 2017, pp. 261-271.
Wang et al, "A Quasi-Passive CMOS Pipeline D/A Converter", IEEE Journal of Solid-State Circuits, vol. 24, No. 6, Dec. 1989, pp. 1752-1755.

\* cited by examiner

MEMORY ARRAY FOR PROCESSING AN N-BIT WORD

BACKGROUND

The present disclosure relates to the field of digital computer systems, and more specifically, to a memory array for processing an N-bit word.

The computational memory is a promising approach in the field of non-von Neumann computing paradigms. In particular, the computational memory is useful for computing multiplication of matrices and vectors. However, there is a continuous need to improve such computations.

SUMMARY

Various embodiments provide a memory array for processing an N-bit word, method, electronic system and computer program product as described by the subject matter of the independent claims. Advantageous embodiments are described in the dependent claims. Embodiments of the present invention can be freely combined with each other if they are not mutually exclusive.

In one aspect, the present disclosure relates to a memory array for processing an N-bit word. The memory array comprises: a data block comprising N serially connected cells, each cell of the cells comprising a memory element storing a respective bit of the word, a charge adding unit (e.g. a capacitor) and a switching logic, wherein the last cell of the cells is further configured to receive a sequence of M bits; and an output block serially connected to the data block, comprising a result accumulation unit (e.g. a capacitor); wherein the memory array is configured to operate in accordance with a 3-phase clocking scheme having a sequence of M groups of clock cycles associated with the respective sequence of M bits, the memory array being configured such that a successive and repetitive application of the three phases enables an application of a phase during each clock cycle of the M groups; wherein for each group of the M groups, the data block is configured such that by application of the phases during the clock cycles of that group, the voltage across the charge adding unit of the last cell is the analog voltage which corresponds to the N-bit word scaled by the bit associated with said group; wherein the result accumulation unit is configured to accumulate the scaled voltage during a clock cycle following said group in response to the application of a phase of the three phases.

In another aspect, the present disclosure relates to an electronic system comprising one or more rows and/or one or more columns of memory arrays according to the preceding embodiment.

In another aspect, the present disclosure relates to a method for processing an N-bit word in a memory array, the memory array comprising: a data block comprising N serially connected cells, each cell of the cells comprising a memory element storing a respective bit of the word, a charge adding unit and a switching logic, wherein the last cell of the cells is further configured to receive a sequence of M bits; and an output block serially connected to the data block, comprising a result accumulation unit. The method comprises providing a 3-phase clocking scheme having a sequence of M groups of clock cycles associated with the respective sequence of M bits; for each group of the M groups, applying the phases during the clock cycles of that group in accordance with the 3-phase scheme such that the voltage across the charge adding unit of the last cell is the analog voltage which corresponds to the N-bit word scaled by the bit associated with said group; accumulating the scaled voltage during a clock cycle following said group in response to the application of a phase of the three phases.

In another aspect, the present disclosure relates to a computer program product comprising a computer-readable storage medium having computer-readable program code embodied therewith, the computer-readable program code configured for processing an N-bit word in a memory array, the memory array comprising: a data block comprising N serially connected cells, each cell of the cells comprising a memory element storing a respective bit of the word, a charge adding unit and a switching logic, wherein the last cell of the cells is further configured to receive a sequence of M bits; and an output block serially connected to the data block, comprising a result accumulation unit. The computer-readable program code configured for: for each group of the M groups, applying the phases during the clock cycles of that group in accordance with the 3-phase scheme such that the voltage across the charge adding unit of the last cell is the analog voltage which corresponds to the N-bit word scaled by the bit associated with said group; accumulating the scaled voltage during a clock cycle following said group in response to the application of a phase of the three phases.

BRIEF DESCRIPTION OF THE DRAWINGS

In the following embodiments of the invention are explained in greater detail, by way of example only, making reference to the drawings in which.

DETAILED DESCRIPTION

Figure 1:
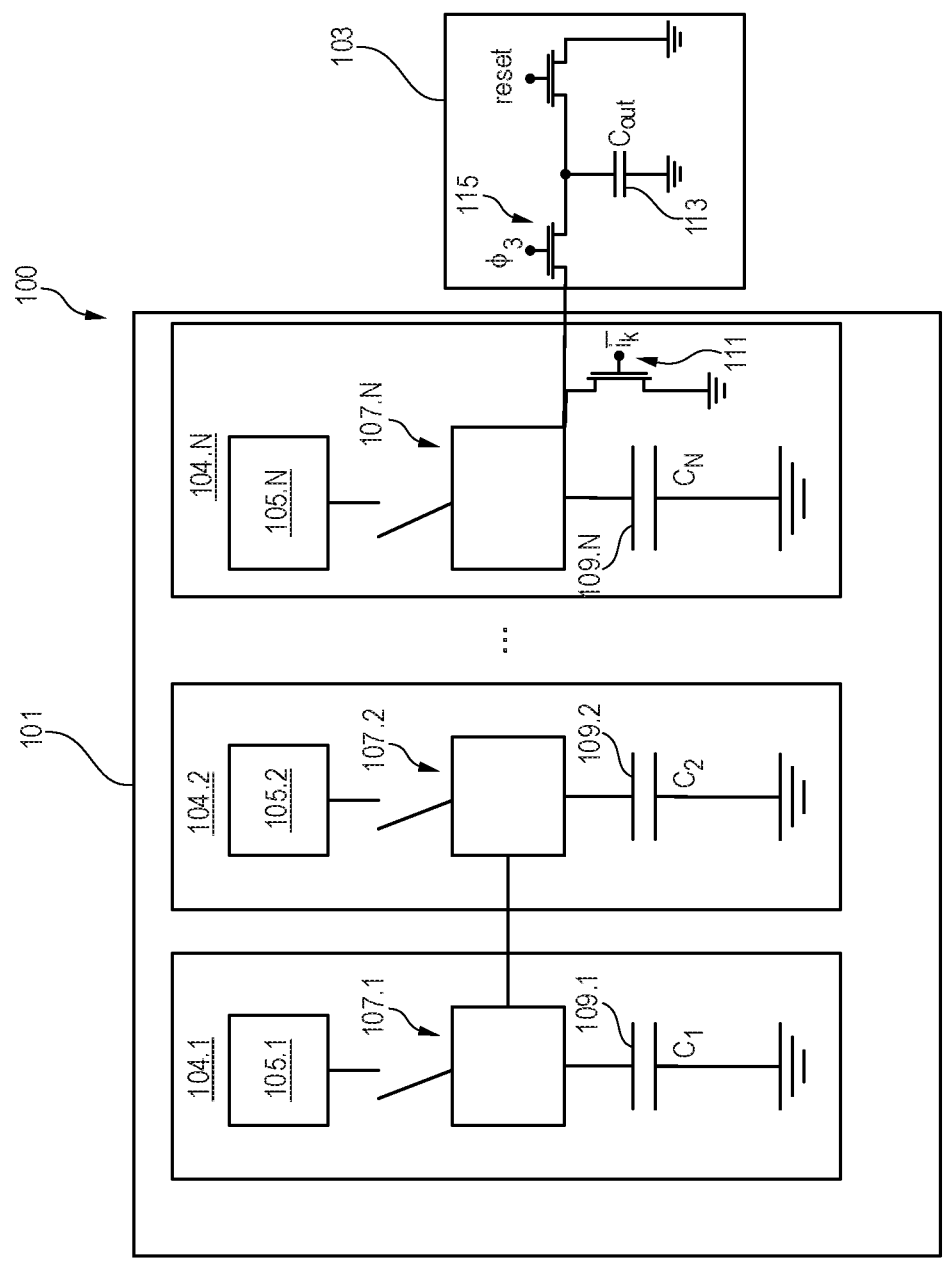
FIG. 1 is a diagram of a memory array or memory system for processing an N-bit word in accordance with an example of the present subject matter.

The descriptions of the various embodiments of the present invention will be presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The present subject matter may for example provide a computational memory system with information stored in N-bit words in a number of rows and columns. Each N-bit word (digital value) is stored in a word block (or memory array) which contains memory elements, a bank of capacitors and additional complementary metal-oxide-semiconductor (CMOS) devices. The memory elements storing the N-bit words may be Static random-access memory (SRAM), resistive random access memory (RRAM), phase change memory (PCM) or dynamic random-access memory (DRAM) memory cells. Each block storing an N-bit word may be configured of mapping this digital value into a word proportional voltage using the capacitors and CMOS devices located within this block. Each block storing an N-bit word is capable of locally multiplying the word-proportional voltage with an M-bit input vector, which is supplied serially as a stream of digital bits. This multiplication happens in the analog domain with the result being again a voltage. The resulting voltage on the output capacitor within this word block, corresponding to the result of the N-bit word times M-bit input. The output capacitor having the result of that multiplication can be connected to output capacitors of other cells along row and/or column to perform a sum and average operation with different results. The resulting voltage and/or the summed voltages on the rows and columns may be digitized using an Analog-to-Digital Converter (ADC).

The present subject matter may enable an efficient and resource saving system for performing multiplications. The present subject matter may enable to perform computational tasks using computational memory cores/units and thus minimizing the need to shuttle data back and forth between a processor and memory as in the standard processing. The present subject matter may have several applications or may be used for performing multiplications such as the present multiplication as required in linear equation solvers, optimization solvers, stochastic gradient descents, deep learning inference and training, Kalman filtering, sparse coding, temporal correlation detection, Fast Fourier transforms, coding and decoding algorithms etc.

In particular, the present subject matter may solve the problem of systematic bandwidth limitations which are due to the fact that only one row at a time can be processed, thus leading to a O(N) complexity instead of O(1) as it may be the case with the present subject matter. The present subject matter may solve the limited scalability issue which is due to the fact that column based digital-to-analog converter (DAC) designs may depend heavily on the field-effect transistor (FET) on resistances and on the fact that adding one or more bits to the weights for such designs may require doubling the pre-charge time (leading to an exponential scaling and not a linear scaling). The present subject matter may provide a compact structure, e.g., avoiding large ADC with separate capacitive digital-to-analog converter (CDAC) in an array periphery.

For example, the present subject matter may enable to perform a matrix vector multiplication such as the multiplication of the matrix $$W \begin{pmatrix} W_{11} & W_{12} \\ W_{21} & W_{22} \end{pmatrix}$$

by vector $$v \begin{pmatrix} i_1 \\ i_2 \end{pmatrix}.$$

W and v may for example be a matrix and vector of real numbers. The product of W and v may be the following vector $$W \cdot v = \begin{pmatrix} W_{11} \cdot i_1 + W_{12} \cdot i_2 \\ W_{21} \cdot i_1 + W_{22} \cdot i_2 \end{pmatrix}.$$

The present subject matter may enable to compute each of the four elements or items $W_{11} \cdot i_1$, $W_{12} \cdot i_2$, $W_{21} \cdot i_1$ and $W_{22} \cdot i_2$. For example, for computing the item $W_{11} \cdot i_1$, the present subject matter may receive as inputs the N-bit word that represents $W_{11}$ and the M bits that represent $i_1$ (e.g. element of matrix W and vector v may be represented by different or same number of bits). The resulting product W.v may for example be scaled by a predefined scale factor that is inherent to the system to obtain the final product result.

The charge adding unit may for example be a capacitor. The result accumulation unit may for example be a capacitor. According to one embodiment, the first group of the M groups comprises 2+N clock cycles, wherein the voltage across the capacitor of each cell of the data block has an analog voltage which corresponds to the respective bit of the word. The first cycle of the 2+N cycles may for example be used for resetting the memory array. This embodiment may enable a mapping of the memory element's value into a voltage by usage of a pipelined charge sharing scheme, which scales linear in time with the number of bits. Also, this embodiment may enable that the multiplication of the voltage which corresponds to an analog weight representation times an input value happens in accordance with a distributive law in conjunction with the charge sharing algorithm.

The number of N bits of the word to be processed can be chosen arbitrarily from most significant bit (MSB) only to MSB until least significant bit (LSB).

According to one embodiment, each group of the M groups, subsequent to the first group, comprises three clock cycles. The first group of the M groups comprises 2+N clock cycles and the number of cycles needed for the remaining M−1 groups is 3×(M−1), as the preceding capacitor may have the weight proportional voltage settled.

According to one embodiment, the output block further comprises a switching logic for connecting the result capacitor to a summing node, the switching logic being configured to be switched by application of an additional phase during a clock cycle that follows the M group of cycles. The three phase clocking scheme may be enhanced by using the additional phase signal as well as a reset signal for outputting the results and for initialization of the memory array respectively.

According to one embodiment, the memory array further comprises an initialization block that is serially connected to the data block, the initialization block being the first connected block followed by the data block and followed by the output block, the initialization block comprising a capacitor, wherein the initialization block is configured such that by application of a phase during the first clock cycle of the group of cycles, the voltage across the capacitor is initialized to a reference voltage. The initialization block may be referred to as a LSB block that may enable to correctly scale the capacitor voltage during a digital/analog (D/A) process.

The last cell of the data block contains a logic which allows to perform the multiplication of weight×input in the analog domain using the weight proportional voltages on the capacitor of that last cell scaled in accordance with the input bits.

According to one embodiment, the memory array further comprises an additional memory element comprising a sign bit indicative of the sign of the word, an additional input indicative of the sign of a vector of the M-bits and a sign processing unit outputting the sign of the multiplication result, based on the sign of the N-bit word and the input vector wherein each of the memory elements is connected to a precharge voltage selection unit that is configured to use receive the sign of the multiplication result and to scale the bit of the memory element using the received sign. For example, the information on the multiplication result's sign may be used to obtain the corresponding analog representation of the result while respecting its sign. This could be done by either using differential charge accumulation units, e.g. pairs of capacitors or using differential pre-charge voltages. This embodiment may extend the analog operations such as multiplications and accumulations to support signed multiplication. This might be done by combining the sign information from N-bit word and M input bits.

According to one embodiment, the M bits are successively applied from the MSB to LSB of the M bits. Based on the input bits which are supplied from MSB to LSB a weighted charge sum may be built on an additional output capacitor e.g. the result accumulation unit.

According to one embodiment, the memory element comprises one of a SRAM, RRAM, PCM or DRAM memory element.

FIG. 1 is a diagram of a memory array or memory system 100 for processing an N-bit word in accordance with an example of the present subject matter.

The memory array 100 comprises a data block 101 and an output block 102. The output block 103 is serially connected to the data block 101 e.g. as indicated by the connection between switching logic 115 of the output block and switching logic 107.N. The data block 101 comprises N serially connected (e.g. cell 104.2 is serially connected to cell 104.1 as indicated by the connection between the switching logics 107.1 and 107.2) cells 104.1-104.N, wherein each cell is associated with a bit of the N-bit word. Each cell 101.1-101.N comprises a respective memory element 105.1-N, switching logic 107.1-N and capacitor 109.1-N. And the last cell 104.N (e.g. cell 104.1 is the first connected cell of cell 104.N is the last connected cell of the series of cells 104.1-N) is further configured to receive a stream of M bits via a data source 111 of the cell 104.N. A reset signal may be used to reset the memory array 100 as illustrated by the reset transistor of the output block 103.

The memory element 105.1-N may be a SRAM, RRAM, PCM or DRAM memory cell. The memory element 105.1-N of each cell 104.1-N is configured to store a respective bit $b_{1-N}$ of the N-bit word. The switching logic 107.1-N of each cell 104.1-N is configured such that the corresponding capacitor 109.1-N of the cell can be pre-charged or charged (e.g. from another capacitor) in response to the application of a clock signal at the switching logic 103.1-N. The switching logic 107.1-N of each cell 104.1-N is further configured to connect the corresponding capacitor 109.1-N of the cell to the memory element 105.1-N of the cell in response to an application of another clock signal at the switching logic 107.1-N.

The output block 103 comprises a result capacitor 113 and a switching logic 115. The switching logic 115 is configured such that the result capacitor 113 of the output block can be pre-charged or charged in response to the application of a clock signal at the switching logic 115.

The memory array 100 is configured to operate in accordance with a three phase clocking scheme having three phase signals (or phases) $\phi_1$, $\phi_2$ and $\phi_3$. For each bit of the stream of M bits to be received at the last cell 104N, the three clocking scheme provides a respective group of clock cycles. This results in a sequence of M groups of cycles.

By performing a successive and repetitive pipelined application of the three phase signals during a given group of the M groups, a phase signal is applied during each cycle of the given group and. This may enable the memory array 100 to map the digital values $b_{1-N}$ stored in each cell into a word proportional voltage, and to transfer the word proportional voltages of the capacitors $C_1$ to $C_{N-1}$ to the last capacitor $C_N$ such that the voltage $V_{CN}$ across the capacitor $C_N$ of the last cell is the analog voltage which corresponds to the N-bit word scaled by the bit $i_k$ associated with said given group ($V_{CN}*i_k$).

The result capacitor 113 may be configured to integrate or perform the sum of ($V_{CN}*i_k$) over the M groups, k=1 to M.

Figure 2A:
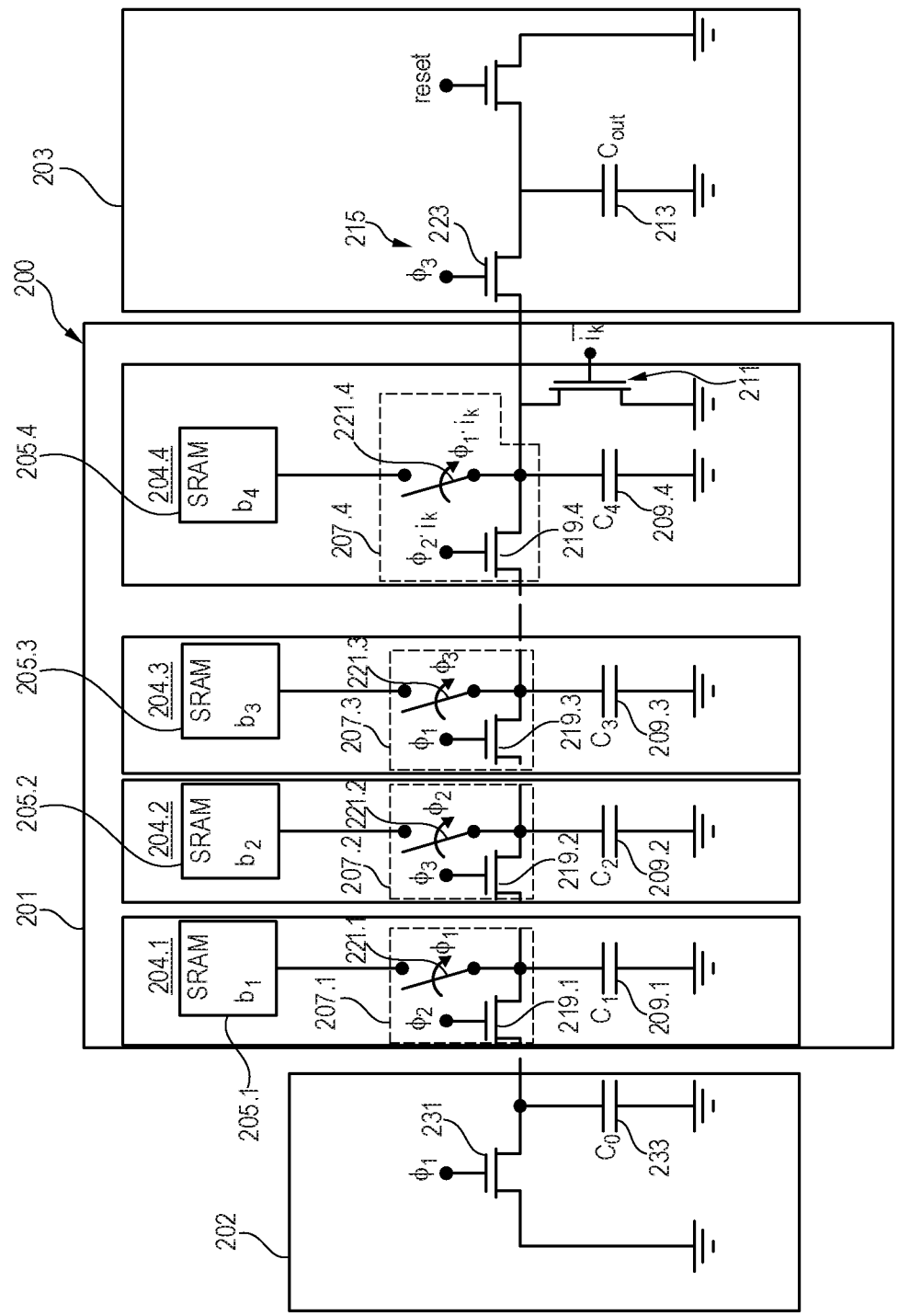
FIG. 2A is a diagram of a memory array for processing a 4-bit word in accordance with an example of the present subject matter.
Figure 2B:
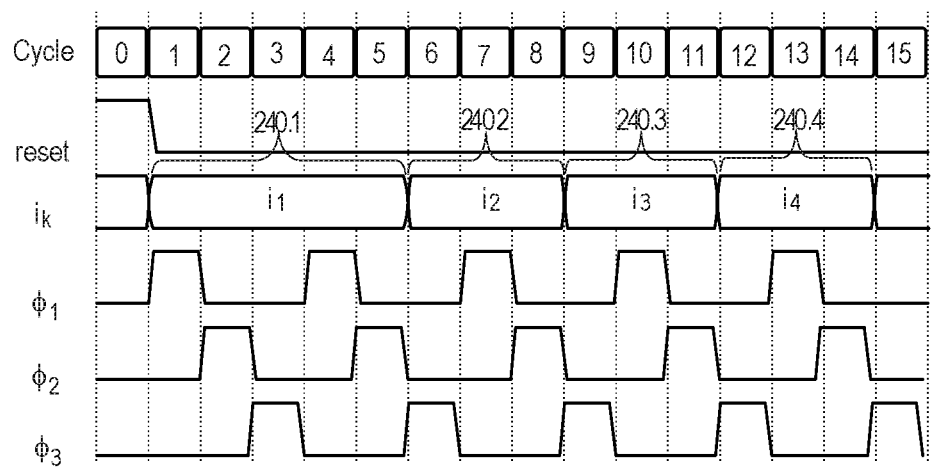
FIG. 2B is a diagram illustrating a three phase clocking scheme in accordance with an example of the present subject matter.

FIG. 2A is a diagram of a memory array 200 for processing a 4-bit word in accordance with an example of the present subject matter. The memory array 200 may be configured to operate in accordance with the three phase clocking signal as illustrated in FIG. 2B.

The memory array 200 comprises an initialization block 202, data block 201 and an output block 203. The output block 103 is serially connected to the data block 101, which is serially connected to the initialization block 202 as indicated in FIG. 2A. The data block 201 comprises 4 serially connected cells 204.1-204.4, wherein each cell is associated with a bit of the 4-bit word. The output block is the last block and the initialization block is the first clock of serially connected blocks.

Each cell 201.1-201.4 comprises a SRAM 205.1-4 for storing a respective bit of the 4-bit word, switching logic 207.1-4 and capacitor 209.1-4. The switching logic 207.1-4 of each cell 204.1-4 comprises a switch transistor 219.1-4 and a switch 221.1-4. And the last cell 204.4 is further configured to receive a stream of M=4 bits $i_1$, $i_2$, $i_3$ and $i_4$ via a data source 211 of the cell 204.4.

The output block 203 comprises a result capacitor 213 and a switching logic 215. The switching logic 215 of the output block 203 comprises a switch transistor 223. The initialization block 202 comprises a switch transistor 231 and a capacitor 233.

The memory array 200 may operate in accordance with a three phase clocking scheme (three phase passive D/A) illustrated in FIG. 2B. FIG. 2B shows the three phase clocking scheme having three signals $\phi_1$, $\phi_2$ and $\phi_3$ and a succession of four groups 240.1-240.4 of cycles that are associated with the 4 stream bits $i_1$, $i_2$, $i_3$ and $i_4$ respectively.

The first group of cycles 240.1 may comprise 2+N clock cycles, namely 6 clock cycles from clock cycle 0 to clock cycle 5. Each of the remaining groups of cycles 240.2 to 240.4 may comprise a same number of cycles which is equal to M−1, namely three clock cycles (M=4). Thus, the total number of clock cycles that is involved in the operation of the memory array 200 in accordance with the clocking scheme of FIG. 2B may be $n_{cycles}=(2+N)+(M-1)\times 3$.

In operation, a reset signal is applied at the output block during clock cycle 0. After the reset signal goes low, the signals $\phi_1$, $\phi_2$ and $\phi_3$ for the three phase passive D/A are generated and applied as follows.

During clock cycle 1, the signal $\phi_1$ is simultaneously applied to two switch transistors 231 and 219.3 and to two switches, namely switch 221.1 and 221.4, thereby closing said switches. During the application of the signal $\phi_1$, the capacitor 233 of the initialization block is pre-charged to a reference voltage $V_{C0}$, and the bit values b1 and b4 of the SRAMs 205.1 and 205.4 are mapped to respective word proportional voltages $b_1 \times V_{DD}$ across the capacitor 209.1 and $b_4 \times V_{DD}$ across the capacitor 209.4. During clock cycle 2, the signal $\phi_2$ is simultaneously applied to two switch transistors 219.1 and 219.4 and one switch, namely switch 221.2, thereby closing said switches. During the application of the signal $\phi_1$, the capacitor 209.1 is charged to the voltage $V_{C1} = b_1 \times V_{DD} + 0.5 \times V_{C0}$, and the bit value b2 of the SRAM 205.2 is mapped to a word proportional voltage $b_2 \times V_{DD}$ across the capacitor 209.2. During clock cycle 3, the signal $\phi_3$ is simultaneously applied to two switch transistors 219.2 and 223 and one switch, namely switch 221.3, thereby closing said switches. During the application of the signal $\phi_3$, the capacitor 209.2 is charged to the voltage $V_{C2} = b_2 \times V_{DD} + 0.5 \times V_{C1}$, and the bit value b3 of the SRAM 205.3 is mapped to a word proportional voltage $b_2 \times V_{DD}$ across the capacitor 209.3.

After completing the first successive application of the three signals $\phi_1$, $\phi_2$ and $\phi_3$ all bit values b1 to b4 are mapped to respective word proportional voltages in the respective capacitors. After completing the first successive application of the three signals $\phi_1$, $\phi_2$ and $\phi_3$ a repetition of that application may be performed so that during clock cycle 4, and as with cycle 1, the signal $\phi_1$ is simultaneously applied to the switches 231, 219.3, 221.1 and 221.4, thereby closing said switches. During the application of the signal $\phi_1$ in cycle 4, the capacitor 209.3 is charged to the voltage $V_{C3} = b_3 \times V_{DD} + 0.5 \times V_{C2}$. During clock cycle 5, and as with cycle 2, the signal $\phi_2$ is simultaneously applied to the switches 219.1, 219.4 and 221.2, thereby closing said switches. During the application of the signal $\phi_2$ in cycle 5, the last capacitor 209.4 of the data block is charged to the voltage $b_4 \times V_{DD} + 0.05 \times V_{C3}$ scaled by the bit $i_1$ which is applied or received during the first group of cycles 240.1, resulting in $V_{C4}^{k=1} = (b_4 \times V_{DD} + 0.5 \times V_{C3}) \times i_1$.

Thus, the three phase scheme enables that after the application of the signals $\phi_1$, $\phi_2$ and $\phi_3$ during the first group of cycles 240.1, the last capacitor 209.4 of the data block 201 gets charged with a voltage that represents the 4-bit word. And the following groups of cycles 240.2 to 240.4 may be used to multiply the voltage across the last capacitor 209.4 of the data block 201 with the remaining 3 bits $i_2$ to $i_4$ as follows.

During clock cycle 6, and as with cycle 3, the signal $\phi_2$ is simultaneously applied to the switches 219.2, 223 and 221.3, thereby closing said switches. During the application of the signal $\phi_2$ in cycle 6, the result capacitor 213 is charged to the voltage $V_{Cout}^{k=1} 0.5 \times V_{C4}^{k=1}$.

After clock cycle 6, the result capacitor 213 has accumulated a first voltage value that is indicative of $b_4 \times V_{DD} + 0.5 \times V_{C3}$ scaled by $i_1$. And, in order to accumulate the remaining items of the multiplication, namely $b_4 \times V_{DD} + 0.5 \times V_{C3}$ scaled by $i_2$, $i_3$ and $i_4$, the last capacitor needs to be charged to and to further accumulate $V_{C4}^{k=2} = (b_4 \times V_{DD} + 0.5 \times V_{C3}) \times i_2$, $V_{C4}^{k=3} = (b_4 \times V_{DD} + 0.5 \times V_{C3}) \times i_3$ and $V_{C4}^{k=4} = (b_4 \times V_{DD} + 0.5 \times V_{C3}) \times i_4$ as follows.

During clock cycles 7 and 8, signals $\phi_1$ and $\phi_2$ are successively applied as described above. And since the bit value $i_2$ is being received during the second group of cycles 240.2, the last capacitor 209.4 of the data block is charged to the voltage $b_4 \times V_{DD} + 0.5 \times V_{C3}$ scaled by the bit $i_2$ which is applied or received during the second group of cycles 240.2, resulting in $V_{C4}^{k=2} = (b_4 \times V_{DD} + 0.5 \times V_{C3}) \times i_2$. During clock cycle 9, and as with cycle 3, the signal $\phi_3$ is simultaneously applied to the switches 219.2, 223 and 221.3, thereby closing said switches. During the application of the signal $\phi_3$ in cycle 9, the result capacitor 213 is charged to the voltage $V_{Cout}^{k=2} = V_{Cout}^{k=1} + 0.5 \times V_{C4}^{k=2}$.

During clock cycles 10 and 11, signals $\phi_1$ and $\phi_2$ are successively applied as described above. And since the bit value $i_3$ is being received during the third group of cycles 240.3, the last capacitor 209.4 of the data block is charged to the voltage $b_4 \times V_{DD} + 0.5 \times V_{C3}$ scaled by the bit $i_3$ which is applied or received during the third group of cycles 240.3, resulting in $V_{C4}^{k=2} = (b_4 \times V_{DD} + 0.5 \times V_{C3}) \times i_3$. During clock cycle 12, and as with cycle 3, the signal $\phi_2$ is simultaneously applied to the switches 219.2, 223 and 221.3, thereby closing said switches. During the application of the signal $\phi_2$ in cycle 12, the result capacitor 213 is charged to the voltage $V_{Cout}^{k=3} = V_{Cout}^{k=3} + 0.5 \times V_{C4}^{k=3}$.

During clock cycles 13 and 14, signals $\phi_1$ and $\phi_2$ are successively applied as described above. And since the bit value $i_4$ is being received during the second group of cycles 240.3, the last capacitor 209.4 of the data block is charged to the voltage $b_4 \times V_{DD} + 0.5 \times V_{C3}$ scaled by the bit $i_4$ which is applied or received during the second group of cycles 240.4, resulting in $V_{C4}^{k=4} = (b_4 \times V_{DD} + 0.5 \times V_{C3}) \times i_4$. During clock cycle 15, and as with cycle 3, the signal $\phi_3$ is simultaneously applied to the switches 219.2, 223 and 221.3, thereby closing said switches. During the application of the signal $\phi_3$ in cycle 15, the result capacitor 213 is charged to the voltage $V_{Cout}^{k=4} = V_{Cout}^{k=3} + 0.5 \times V_{C4}^{k=4}$.

Thus, after clock cycle 15, the result of the multiplication of the 4-bit word and the 4 bits i1 to i4 is stored in the result capacitor 213. In one example, this result of multiplication may further be used by providing it to a user of the memory array 200 e.g. for further usage by the user.

As described with reference to FIG. 2A, the multiplication of an N-bit word stored in the array 200 with an M-bit input vector may be performed using an interleaved charge sharing procedure. This procedure may make use of the capacitors and a CMOS logic (switching logics of memory array 200 may be CMOS logics) located in this array 200.

Figure 3B:
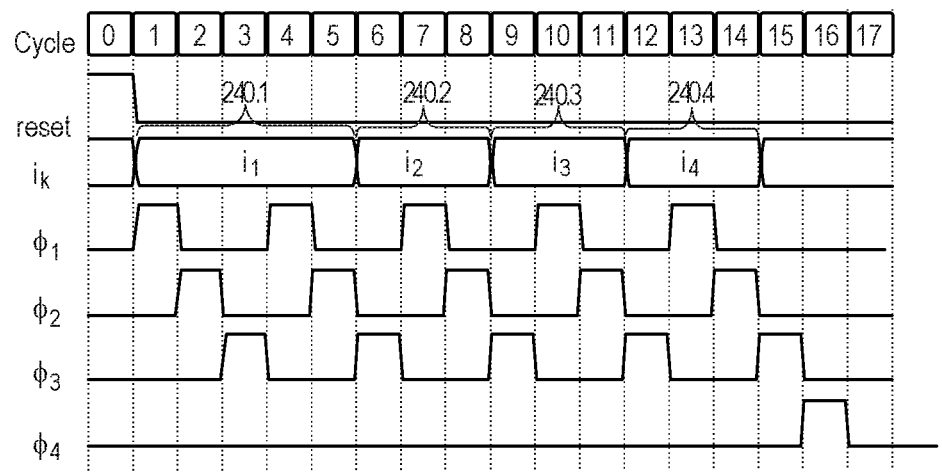
FIG. 3B is a diagram illustrating a three phase clocking scheme in accordance with an example of the present subject matter.
Figure 3A:
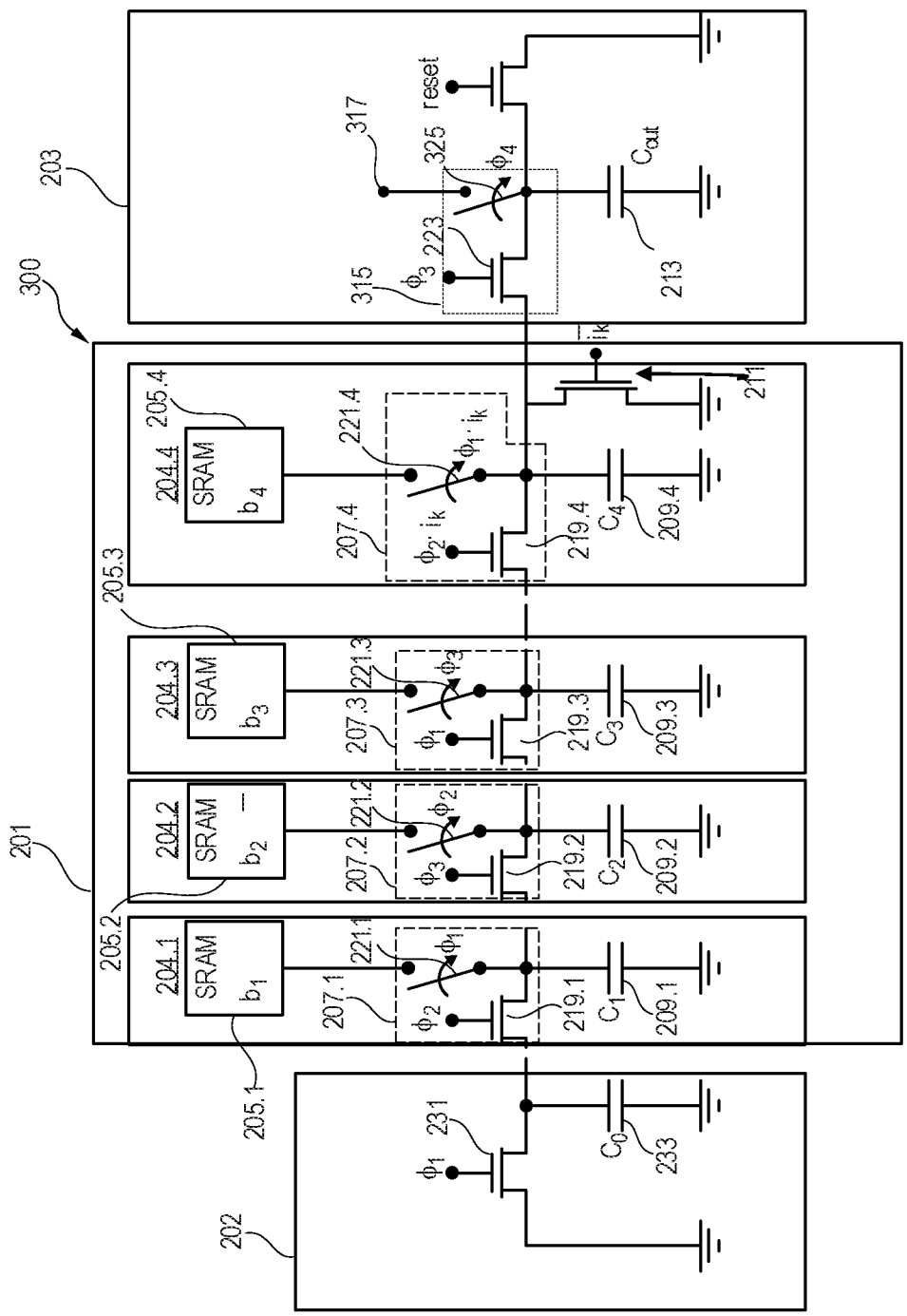
FIG. 3A is a diagram of a memory array for processing a 4-bit word in accordance with an example of the present subject matter.

In another example, the result of multiplication may be provided to a summing node 317 as shown in FIG. 3A. The memory array 300 of FIG. 3A is similar to the memory array of FIG. 2A and has in addition a switch 325 in the switching logic 315 at the output block 203. The switch 325 may be closed by application of an additional signal $\phi_4$ as illustrated in FIG. 3B. The clocking scheme illustrated in FIG. 3B is similar to the scheme of FIG. 2B and may require in addition, the application of the signal $\phi_4$ using clock cycle 16, i.e., after the result capacitor has a voltage representing the result of the multiplication of the 4-bit word and the 4 bits it to i4. During application of signal $\phi_4$, the switch 325 closes in order to connect the result capacitor 213 to a summing node 317, such that the summing node can sum the result of multiplication of the memory array 200 with other results of multiplication of other memory arrays such as memory array 200 of a row or a column of memory arrays.

Figure 4:
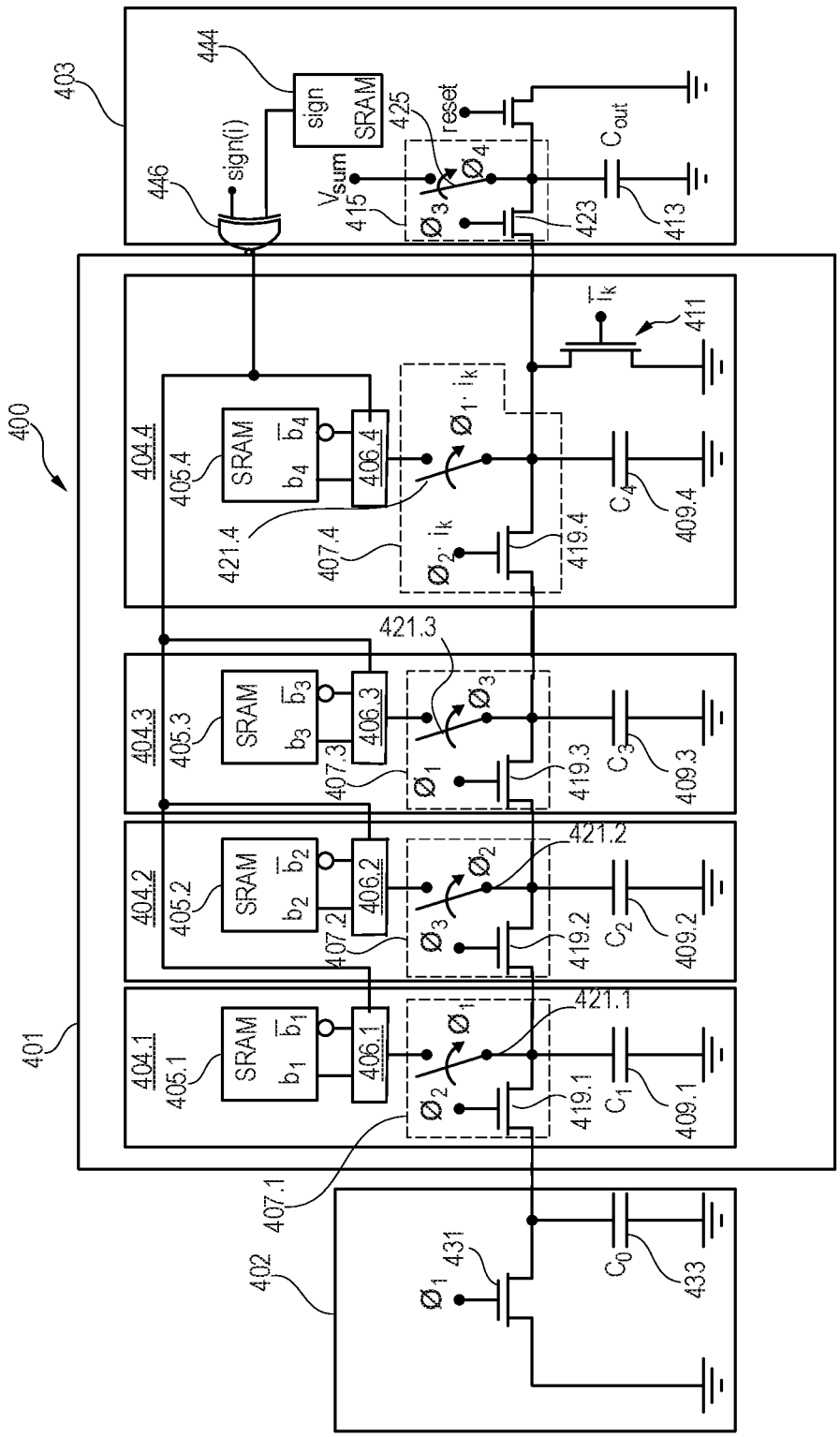
FIG. 4 is a diagram of a memory array for processing a signed 4-bit word in accordance with an example of the present subject matter.

FIG. 4 is a diagram of a memory array 400 for processing a signed 4-bit word in accordance with an example of the present subject matter. The memory array 400 may be configured to operate in accordance with the three phase clocking signal as illustrated in FIG. 2B.

The memory array 400 comprises an initialization block 402, data block 401 and an output block 403. The output block 403 is serially connected to the data block 401, which is serially connected to the initialization block 402 as indicated in FIG. 4. The data block 401 comprises 4 serially connected cells 404.1-404.4, wherein each cell is associated with a bit of the 4-bit word.

Each cell 401.1-401.4 comprises a SRAM 205.1-4 for storing a respective bit of the 4-bit word, switching logic 407.1-4 and capacitor 409.1-4. Each SRAM 405.1-4 is connected to a precharge voltage selection unit 406.1-4, allowing to select its stored value or its negated form based on a sign value. For example, the precharge voltage selection unit 406.1-4 may be configured to receive a bit b1 to b4 of the respective SRAM 2015.1-4 and to multiply that received bit with the sign value. The resulting multiplied bit is then used for charging the respective capacitor 409.1-4. This may be needed to map the negative values correctly into the analog domain in the charge sharing. The switching logic 407.1-4 of each cell 404.1-4 comprises a switch transistor 419.1-4 and a switch 421.1-4. And the last cell 404.4 is further configured to receive a stream of M=4 bits $i_1$, $i_2$, $i_3$ and $i_4$ via a data source 411 of the cell 404.4.

The output block 403 comprises a result capacitor 413, a switching logic 415 and a SRAM 444 for storing a bit indicative of the sign of the 4-bit word and an XOR gate 446. The XOR gate 446 is configured to receive the sign bit from SRAM 444 and a sign of the 4-bit stream being applied and to perform an XOR operation between the received values. The result of the XOR operation which is the sign value may be output of the XOR gate 446 and received at each of the precharge voltage selection units 406.1-4. The switching logic 415 of the output block 403 comprises a switch transistor 423 and a switch 425. The initialization block 402 comprises a switch transistor 431 and a capacitor 433.

The operation of the memory array 400 in accordance with the three phase clocking scheme of FIG. 2B may be described as with reference to FIG. 2A, with the exception that when switches 421.1 to 421.4 are closed, the bit value $b_{chosen}$ provided by the corresponding precharge voltage selection unit and the chosen value $b_{chosen}$ is mapped to the respective word proportional voltage $b_{chosen} \times V_{DD}$. For example if b1=1 and the sign of the product is −1, $b_{chosen}$=−1. For example if b1=0 and the sign of the product is −1, $b_{chosen}$=0.

Figure 5:
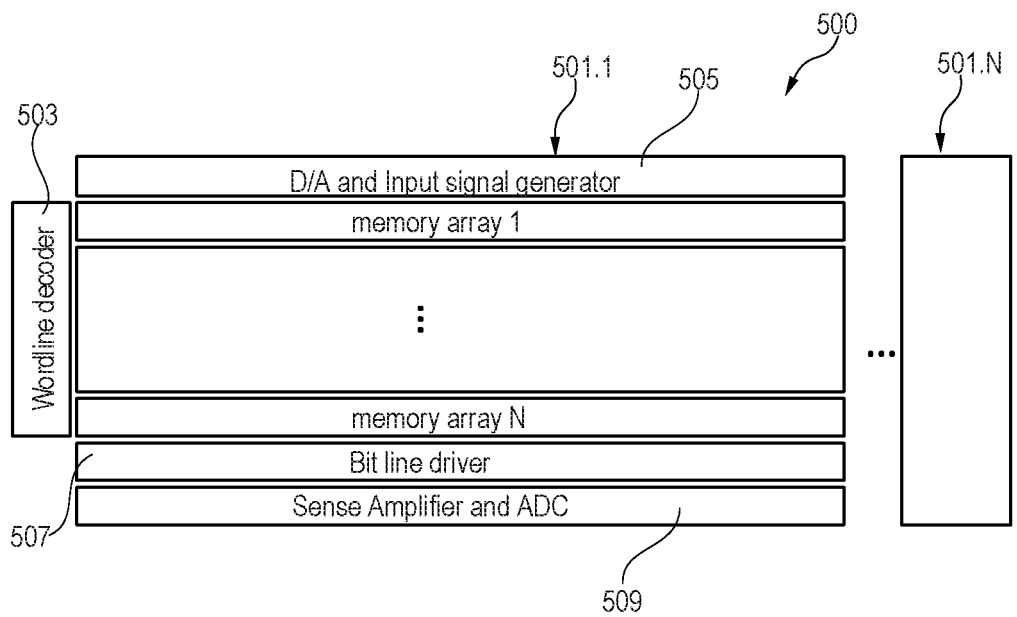
FIG. 5 is a diagram of an electronic system in accordance with an example of the present subject matter.

FIG. 5 is a diagram of an electronic system 500 in accordance with an example of the present subject matter. The system 500 may be configured to provide a combination of multiplication results such as the sum of multiplication results, which may provide the result of a multiplication of matrix by a vector. For example, for the multiplication of $$W \begin{pmatrix} W_{11} & W_{12} \\ W_{21} & W_{22} \end{pmatrix}$$

by vector $$v \begin{pmatrix} i_1 \\ i_2 \end{pmatrix}$$

the system 500 may provide the two sums/items of the product $$W \cdot v = \begin{pmatrix} W_{11} \cdot i_1 + W_{12} \cdot i_2 \\ W_{21} \cdot i_1 + W_{22} \cdot i_2 \end{pmatrix}.$$

namely $W_{11} \cdot i_1 + W_{12} \cdot i_2$ and $W_{21} \cdot i_1 + W_{22} \cdot i_2$.

Each of the multiplication results (e.g. each of $W_{11} \cdot i_1$, $W_{12} \cdot i_2$, $W_{21} \cdot i_1$ and $W_{22} \cdot i_2$) may be computed by a respective memory array such as the memory array of FIG. 1, FIG. 2A or FIG. 4. For obtaining the final results of the product W.v by the system 500, the system 500 may have a predefined structure of the memory arrays that compute the individual multiplication results. For example, the electronic system 500 may comprise an array of one or more columns and/or one or more rows, wherein a column comprises memory arrays such as memory arrays of FIG. 1, FIG. 2A or FIG. 4 and a row comprises memory arrays such as memory arrays of FIG. 1, FIG. 2A or FIG. 4. Following the example above of the product W.v, the electronic system may comprise two rows and two columns and each row (column) comprises two memory arrays. The first row of memory arrays may compute the sum $W_{11} \cdot i_1 + W_{12} \cdot i_2$ and the second row of memory arrays may compute the other sum $W_{21} \cdot i_1 | W_{21} \cdot i_2$.

The multiplication results obtained by the memory arrays of each column of the system 500 may be combined e g summed by the electronic system 500. Or, the multiplication results obtained by the memory arrays of each row of the system 500 may be combined e g summed by the electronic system 500. The logic used for computing the multiplication result by a memory array of the column may be shared with other memory arrays on the same row and/or column. For performing the sum of multiplication results of memory arrays of a row, the two result capacitors e.g. 113 of the two memory arrays may be connected to the same summing node 317 in order to perform the sum of their multiplication results at the summing node 317. For example, the summation of all voltages along a row or column happens when the result capacitors of the memory arrays of the row or column are shorted together.

In one example, and as shown in FIG. 5, the electronic system 500 may comprise one or more columns 501.1 to 501.N of memory arrays e.g. of FIG. 2A. For example, column 501.1 may comprise N rows of N memory arrays. Only column 501.1 is described in details for simplification purpose. The other columns 501.N may have a similar structure of column 501.1. The column 501.1 may be connected to a wordline decoder 503 and to an input signal generator such as D/A signal generator 505. The column 501.1 may further be connected to a bit line driver 507. The result of multiplication performed by each of the memory arrays of the column 501.1 may be summed and the resulting sum may be provided to an a (multibit) ADC 509 in order to be able to read out the sum of the analog computation performed at the column 501.1. The resulting voltage may be digitized using the ADC 509 may be located in a periphery. If a SAR ADC topology is chosen for the ADC 509, the distributed output capacitors can be used as part of its capacitive DAC, minimizing the dedicated ADC area required.

Figure 6:
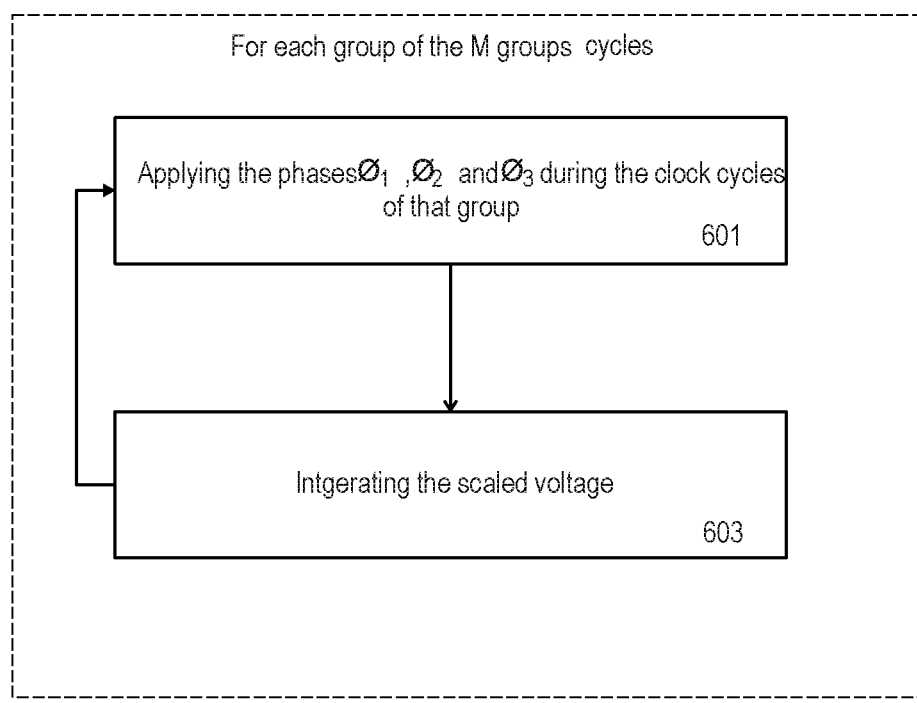
FIG. 6 is a flowchart of a method for processing an N-bit word.

FIG. 6 is a flowchart of a method for processing an N-bit word. For example, the present method may perform, e.g. using memory array 200, a multiplication of the N-bit word with a set of M bits $i_1$ to $i_M$ that represent a value in accordance with a 3-phase clocking scheme. The 3-phase clocking scheme has a sequence of M groups of clock cycles associated with the respective set of M bits. The memory array is configured such that a successive and repetitive application of the three phases enables an application of a phase during each clock cycle of the M groups of cycles.

The N-bit word may represent an item or element of a matrix such as the following matrix $$W\begin{pmatrix} W_{11} & W_{12} \\ W_{21} & W_{22} \end{pmatrix},$$

and the set of M bits $i_1$ to $i_M$ may represent an element of the vector $$v\begin{pmatrix} i_1 \\ i_2 \end{pmatrix}.$$

For each group of the M groups, the phases $\phi_1$, $\phi_2$, $\phi_3$ may be applied in step 601 during the clock cycles of that group in accordance with the 3-phase scheme such that the voltage across the capacitor of the last cell is the analog voltage which corresponds to the N-bit word scaled by the bit associated with said group. The application of the phases is a successive and repetitive application of the three phases (or three phase signals) $\phi_1$, $\phi_2$ and $\phi_3$ which results in applying a phase signal during each clock cycle of the M groups of cycles (e.g. as shown in FIG. 2B).

In step 603, the scaled voltage may be accumulated during a clock cycle (e.g. clock cycle 6 of FIG. 2B) following said group in response to the application of a phase of the three phases.

Steps 601-603 may be repeated for each multiplication result to be computed for the product of matrix with a vector. Following the example above, steps 601 and 603 may be repeated for computing each of the multiplication results $W_{11} \cdot i_1$, $W_{12} \cdot i_2$, $W_{21} \cdot i_1$ and $W_{22} \cdot i_2$. The repetition may be performed using a memory array e.g. of FIG. 2A multiple times or by using an electronic system as described with reference to FIG. 5.

Figure 7:
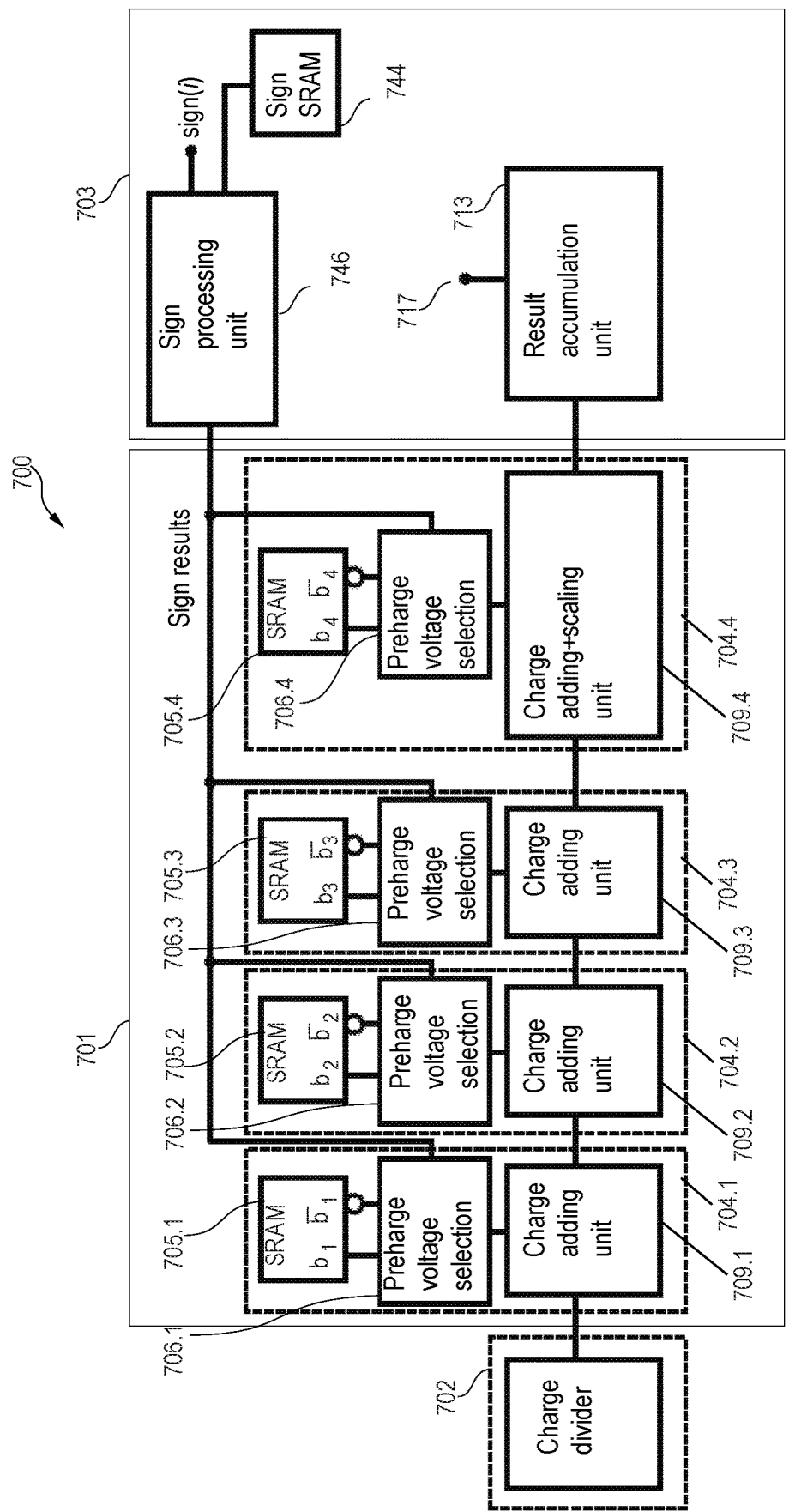
FIG. 7 is a diagram of a memory array for processing a signed 4-bit word in accordance with an example of the present subject matter.

FIG. 7 is a diagram of a memory array 700 for processing a signed 4-bit word in accordance with an example of the present subject matter. The memory array 400 may be configured to operate in accordance with the three phase clocking signal as illustrated in FIG. 2B.

The memory array 700 comprises an initialization block 702, data block 701 and an output block 703. The output block 703 is serially connected to the data block 701, which is serially connected to the initialization block 702 as indicated in FIG. 7.

The initialization block 702 comprises a charge divider that enables to divide the charge of a charge adding unit such as a capacitor. The data block 701 comprises 4 serially connected cells 704.1-704.4, wherein each cell is associated with a bit of the 4-bit word. Each cell 704.1-704.3 comprises a SRAM 705.1-3 for storing a respective bit of the 4-bit word, precharge selection unit 706.1-3 and charge adding units 709.1-3. The last cell 704.4 comprises a SRAM 705.4 for storing a respective bit of the 4-bit word, precharge selection unit 706.4 and charge adding and scaling unit 709.4.

The output block 703 comprises a result accumulation unit 713 that is connected to a summing node 717. The output block may further comprise a SRAM 744 for storing a bit indicative of the sign of the 4-bit word and a sign processing unit 746. The sign processing unit 746 is configured to receive the sign bit from SRAM 744 and a sign of the 4-bit stream being applied and to determine a sign of the product of the 4-bit word and the input vector. The result or output of the sign processing unit 746 which is the sign value may be output and received at each of the precharge voltage selection units 706.1-4.

Upon receiving the sign value and the bit from the corresponding SRAM 7051-4, each of the precharge voltage selection units 706.1-4 may be configured to change the received bit based on the sign value. For example if received bit b1=1 and the sign of the product is −1, precharge voltage selection unit 706.1 may output −1. The output of each of the precharge voltage selection units 706.1-3 may be mapped to a word proportional voltage by the respective charge adding unit 709.1-3. The charge adding and scaling unit 709.4 is further configured to receive the stream of M=4 bits i1, i2, i3 and i4 so that the output of the precharge voltage selection unit 706.4 may be mapped to a word proportional voltage scaled by a bit value of the stream of M input bits by the charge adding and scaling unit 709.4.

The memory array 700 may operate in accordance with a three phase clocking scheme (three phase passive D/A) illustrated in FIG. 2B. FIG. 2B shows the three phase clocking scheme having three signals $\phi_1$, $\phi_2$ and $\phi_3$ and a succession of four groups 240.1-240.4 of cycles that are associated with the 4 stream bits i1, i2, i3 and i4 respectively. The memory array 700 is configured in accordance with the three clocking scheme such that the word proportional voltage that represents the 4-bit word may be scaled by the bit values i1, i2, i3 and i4 and stored in the charge adding and scaling unit 709.4 by successive adding of charges of the different charge adding units 709.1-3. The result accumulation unit 713 may be configured to accumulate (integrate) the 4 scaled word proportional voltages that resulted in the charge adding and scaling unit 709.4. The result of the accumulation by result accumulation unit 713 may be provided to summing node 717, such that the summing node 717 can sum the result of multiplication of the memory array 700 with other results of multiplication of other memory arrays such as memory array 700 of a row or a column of memory arrays.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A memory array for processing an N-bit word, the memory array comprising: a data block comprising N serially connected cells, each cell of the cells comprising a memory element storing a respective bit of the word, a charge adding unit and a switching logic, wherein the last cell of the cells is further configured to receive a sequence of M bits; and
   an output block serially connected to the data block, comprising a result accumulation unit;
   wherein the memory array is configured to operate in accordance with a 3-phase clocking scheme having a sequence of M groups of clock cycles associated with the respective sequence of M bits, the memory array being configured such that a successive and repetitive application of the three phases enables an application of a phase during each clock cycle of the M groups;
   wherein for each group of the M groups, the data block is configured such that by application of the phases during the clock cycles of that group, the voltage across the charge adding unit of the last cell is the analog voltage which corresponds to the N-bit word scaled by the bit associated with said group;
   wherein the result accumulation unit is configured to accumulate the scaled voltage during a clock cycle following said group in response to the application of a phase of the three phases.

2. The memory array of claim 1, wherein the first group of the M groups comprises 2+N clock cycles, wherein the voltage across the charge adding unit of each cell of the data block has an analog voltage which corresponds to the respective bit of the word.

3. The memory array of claim 1, wherein each group of the M groups, subsequent to the first group, comprises three clock cycles.

4. The memory array of claim 1, wherein the output block further comprises a switching logic for connecting the result accumulation unit to a summing node, the switching logic being configured to be switched by application of an additional phase during a clock cycle that follows the M group of cycles.

5. The memory array of claim 1, further comprising an initialization block that is serially connected to the data block, the initialization block being the first connected block followed by the data block and followed by the output block, the initialization block comprising a capacitor, wherein the initialization block is configured such that by application of a phase during the first clock cycle of the group of cycles, the voltage across the capacitor is initialized to a reference voltage.

6. The memory array of claim 1, further comprising an additional memory element comprising a sign bit indicative of the sign of the word, an additional input indicative of the sign of a vector of the M-bits and a sign processing unit outputting the sign of the multiplication result, based on the sign of the N-bit word and sign of the input vector, wherein each of the memory elements is connected to a precharge voltage selection unit that is configured to receive the sign of the multiplication result and to scale the bit of the memory element using the received sign.

7. The memory array of claim 1, wherein the M bits are successively applied from the most significant bit (MSB) to least significant bit (LSB) of the M bits.

8. The memory array of claim 1, the memory element comprising one of a SRAM, RRAM, PCM or DRAM memory element.

9. An electronic system comprising one or more rows and/or one or more columns of memory arrays according to claim 1.

10. The electronic system of claim 9, being configured to combine the multiplication results of each row and column of the electronic system.

11. The electronic system of claim 10, wherein the combination comprises at least one of the sum and the average.

12. A method for processing an N-bit word in a memory array, the memory array comprising: a data block comprising N serially connected cells, each cell of the cells comprising a memory element storing a respective bit of the word, a charge adding unit and a switching logic, wherein the last cell of the cells is further configured to receive a sequence of M bits; and
an output block serially connected to the data block, comprising a result accumulation unit; the method comprising
providing a 3-phase clocking scheme having a sequence of M groups of clock cycles associated with the respective sequence of M bits;
for each group of the M groups, applying the phases during the clock cycles of that group in accordance with the 3-phase scheme such that the voltage across the charge adding unit of the last cell is the analog voltage which corresponds to the N-bit word scaled by the bit associated with said group; and
accumulating the scaled voltage during a clock cycle following said group in response to the application of a phase of the three phases.

13. A computer program product comprising a computer-readable storage medium having computer-readable program code embodied therewith, the computer-readable program code configured for processing an N-bit word in a memory array, the memory array comprising: a data block comprising N serially connected cells, each cell of the cells comprising a memory element storing a respective bit of the word, a charge adding unit and a switching logic, wherein the last cell of the cells is further configured to receive a sequence of M bits; and an output block serially connected to the data block, comprising a result accumulation unit; the computer-readable program code configured for:
for each group of the M groups, applying phases during clock cycles of that group in accordance with a 3-phase scheme such that the voltage across the charge adding unit of the last cell is the analog voltage which corresponds to the N-bit word scaled by the bit associated with said group;
accumulating the scaled voltage during a clock cycle following said group in response to the application of a phase of the three phases.

* * * * *